(12) United States Patent
Ubukata et al.

(10) Patent No.: US 6,462,952 B1
(45) Date of Patent: Oct. 8, 2002

(54) STRUCTURE AND METHOD FOR CONSTRUCTING CIRCUIT MODULE SUITABLE FOR HAND-HELD ELECTRONIC EQUIPMENT

(75) Inventors: Hiroshi Ubukata, Tokyo; Kentaro Tomioka, Saitama-ken, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/870,686

(22) Filed: Jun. 1, 2001

(30) Foreign Application Priority Data

Jun. 2, 2000 (JP) ........................................ 2000-165540

(51) Int. Cl.[7] ............................................... H05K 7/20
(52) U.S. Cl. ........................ 361/719; 165/185; 257/727; 361/704
(58) Field of Search ........................ 174/16.3; 165/80.3, 165/185; 257/718–720, 726, 727; 361/704, 705, 709–712, 717–719, 722

(56) References Cited

U.S. PATENT DOCUMENTS

| | | | | |
|---|---|---|---|---|
| 4,156,458 A | * | 5/1979 | Chu et al. | 165/81 |
| 5,034,803 A | * | 7/1991 | Crowe et al. | 257/688 |
| 5,052,481 A | * | 10/1991 | Horvath et al. | 165/185 |
| 5,926,369 A | * | 7/1999 | Ingraham et al. | 361/699 |
| 6,088,228 A | * | 7/2000 | Petersen et al. | 361/720 |
| 6,332,946 B1 | * | 12/2001 | Emmett et al. | 156/299 |

FOREIGN PATENT DOCUMENTS

| | | |
|---|---|---|
| JP | 60-249391 | 12/1985 |
| JP | 7-142647 | 6/1995 |

* cited by examiner

*Primary Examiner*—Gerald Tolin
(74) *Attorney, Agent, or Firm*—Finnegan, Henderson, Farabow, Garrett & Dunner, L.L.P.

(57) ABSTRACT

A circuit module mounting structure and a method for mounting an IC chip in the circuit module applicable to electronic equipment with a slim body. To increase radiation efficiency of the heat emitted from the IC chip, a heat conducting element including a plurality of thin plates is provided between a radiation plate of a heat sink unit and a surface of the IC chip. Further, the plurality of thin plates of the heat conducting element have sufficient flexibility to absorb stresses appearing at coupling portions of the elements due to dimensional tolerances of the elements.

6 Claims, 3 Drawing Sheets

STRUCTURE AND METHOD FOR CONSTRUCTING CIRCUIT MODULE SUITABLE FOR HAND-HELD ELECTRONIC EQUIPMENT

BACKGROUND OF THE INVENTION

1. Field of the Invention

The present invention relates to structure and method for constructing a circuit module suitable for hand-held electronic equipment with a slim body, e.g., a personal computer that is required to mount electronic elements in a high density in the body. In particular, the present invention relates to structure and method for constructing a circuit module having a novel radiating mechanism that can achieve sufficient radiating efficiency while maintaining reliability of the circuit module during long-term usage.

2. Discussion of the Related Art

Typically, handheld electronic equipment with a slim body, such as a note-book type or a mobile type personal computer (PC), are required to install electronic elements including heating source elements, such as IC chips, in a high density in the slim body. With the widespread use and diversification in the handheld electronic equipment, in particular, in personal computers, there is a strong demand for increasing applications to enhance functions and raise performance of the personal computer.

To enhance functions and raise performance of a personal computer with a slim and small body, there is a need to increase packaging density of electronic elements including heating source elements, such as IC chips, in the slim body. It is also required to increase the number of the electronic elements packaged in order to enhance the functions and to achieve higher performance of the computer.

To enhance the functions of the personal computer, it is substantially required to increase the packaged number of heating source electronic elements, i.e., semiconductor chips, such as IC chips. Consequently, the total amount of the heat generated from the heating source electronic elements rapidly increases in the slim body. To avoid the generated heat adversely affecting other electronic elements installed in the body, the heat in the body need to be sufficiently radiated.

Conventionally, a heat sink unit is commonly used as a radiating mechanism for the generated heat from IC chips in the body of the personal computer. Usually, the heat sink unit is made of a high heat conductivity material, such as aluminum. The heat sink unit includes a radiation panel and a plurality of radiating projections. The radiation panel of the heat sink unit is connected to the heating source element, e.g., an IC chip, in order to transfer and radiate the heat generated from the IC chip into the air through the radiation projections. To increase efficiency of the radiation, it has been considered to increase the radiating surfaces of the heat sink unit as large as possible.

Typically, the circuit module installed in the personal computer includes various components mounted on a printed wire board. Thus, the circuit module is constructed by mounting, for example, a heat sourcing IC, a semiconductor package and a heat sink unit on a printed wire board. However, when the various components are constructed as the circuit module, generally various dimensional tolerances are generated due to the design errors among these components.

Recently, to enhance the packaging density and to achieve multi-connecting pins of the semiconductor package, a Ball Grid Array (BGA) package is widely used as a semiconductor package for installing components in the circuit module. The BGA package is usually connected to a base plate of the printed circuit board through a plurality of ball type solders. However, in the circuit module using the BGA package, there may appear dimensional tolerances during the construction of the circuit module due to deformations of the plurality of ball solders.

If the dimensional tolerance exceeds a permissible positive absolute amount during the construction of the circuit module, a spacing gap is produced in the connecting surfaces between the IC chip and the radiating panel of the heat sink unit. Such a spacing gap deteriorates the efficiency of the radiation through the heat sink unit.

Further, if the dimensional tolerance exceeds a permissible negative absolute amount during the construction of the circuit module, overload stresses appear at the connecting portions with each of the elements since each element presses against others. The stresses at the connecting portions deteriorate reliability of the circuit module for long-term usage.

To avoid the influences of stress, it has conventionally been proposed to interpose a heat connecting material, such as a cool sheet or a grease, between the IC chip and the heat sink unit in order to absorb the dimensional tolerances of elements. Further, it has been proposed to provide a spring mechanism between the printed wire board and the heat sink unit.

However, each of the conventional proposals has serious defects for applying to the circuit module for installing in the personal computer.

Thus, if a cool sheet is interposed between a IC chip and a heat sink unit, the efficiency of the radiation of the generated heat in the circuit module deteriorates depending upon the thickness of the cool sheet since the heat resistance of the cool sheet increases depending upon its thickness. Moreover, when the dimensional tolerances among the elements approaches the maximum amount, it is impossible for the disposed cool sheet to absorb the squeezing power generated between the elements. Consequently, stresses due to the squeezing power concentrate at the connecting portions of the elements. As explained above, this causes deterioration of the reliability of the circuit module.

By providing grease between an IC chip and a heat sink unit, it is possible to reduce the stresses at the connecting portions of the elements. However, the grease leaks around the IC chip deteriorating the efficiency of the radiation.

To absorb the stresses generated at the connecting portions of the module elements, it has been proposed to dispose a spring at the attaching portion between the printed wire board and the heat sink unit. However, such a conventional coupling between the printed wire board and the heat sink unit through the spring requires a very complicated structure for mounting the circuit module.

Furthermore, it has conventionally been proposed to provide metal wires between a heating source element and a radiation unit for transferring the generated heat to the radiation unit. Each of the metal wires has a thermal conductivity and flexibility. It is possible to absorb the dimensional tolerance by using the metal wires. However, the metal wires have a serious defect for obtaining a sufficiency of the radiation effect since the metal wires have small contacting surfaces to the heating element and the radiator.

As explained above, it is essential for a circuit module applicable to a personal computer with a high density to solve both of the reduction of the stresses due to the dimensional tolerances among the circuit elements and the efficient transfer of the heat emitted from the exothermic electronic element, e.g., the IC chip, to the radiation unit. However, there is no teaching of the circuit module that can achieve both the absorption of the dimensional tolerances and the high efficiency of the heat transferring effect of the heat emitted from the IC chip.

SUMMARY OF THE INVENTION

Accordingly, the present inventions is directed to apparatus and method that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the apparatus and method particularly pointed out in the written description and claims hereof as well as the appended drawings.

In accordance with the present invention, there is provided a circuit module structure comprising a wiring base board provided with a wiring pattern, an electronic element mounted on the wiring base board, and a heat sink unit fixed on the wiring board for radiating heat emitted from the electronic element. The heat sink unit includes a radiation panel facing toward the electronic element and having a heat conductivity. Also provided is a heat conducting element between a surface of the heat sink unit facing the electronic element. The heat conducting element comprises a plurality of thin plate-like members having a heat conductivity substantially the same as that of the radiation panel and for transferring the heat emitted from the surface of the electronic element to the radiation panel and a predetermined flexibility for absorbing stresses generated due to dimensional tolerances of the electronic element.

Also in accordance with the present invention, there is provided handheld electronic equipment comprising a slim main body for attaching a data inputting device on one surface of the body and a circuit module provided under the data inputting device in the main body. The circuit module includes a base board provided with a wiring pattern, an IC chip mounted on the base board, and a heat sink unit fixed on the base board. The heat sink unit includes a radiation panel facing toward the IC chip and a heat conducting element provided between the IC chip and the radiation panel of the heat sink unit. The heat conducting element includes a plurality of thin plates each having a heat conductivity for transferring heat emitted from the IC chip to the heat sink unit and a predetermined flexibility for preventing stress from being applied to the IC chip.

Further, in accordance with the present invention, there is provided electronic equipment, comprising: a main body for housing a circuit module, the circuit module having a plurality of circuits for working the electronic equipment, the circuit module including: a base board provided with a wiring pattern; an IC chip mounted on the base board; and a heat sink unit fixed on the base board, the heat sink unit including a radiation panel facing toward the IC chip and a heat conducting element provided between the IC chip and the radiation panel of the heat sink unit, the heat conducting element including a plurality of thin plates each having a heat conductivity for transferring h eat emitted from the IC chip to the heat sink unit and a predetermined flexibility for preventing stress from being applied to the IC chip.

It is to be understood that both the foregoing general description and the following detailed description are exemplary and explanatory and are intended to provide further explanation of the invention as claimed.

BRIEF DESCRIPTION OF THE DRAWINGS

A more complete appreciation of the present invention and its many of attendant advantages thereof will be readily obtained as the same becomes better understood by reference to the following detailed description when considered in connection with the accompanying drawings, wherein.

DESCRIPTION OF THE PREFERRED EMBODIMENTS

Reference will now be made in detail to the preferred embodiments of the present invention, examples of which are illustrated in accompanying drawings. Wherever, possible, the same reference numbers will be used throughout the drawings to refer to the same or like parts.

Embodiments consistent with the present invention provide a novel structure and method for constructing a circuit module structure that achieves both of a high radiation efficiency of the heat emitted from heating source element and effective reduction of stresses among the electronic element due to the dimensional tolerances.

Embodiments consistent with the present invention provide a novel and simplified structure and method for constructing a circuit module suitable for installing in handheld electronic equipment with a slim body in a high density.

Figure 1:
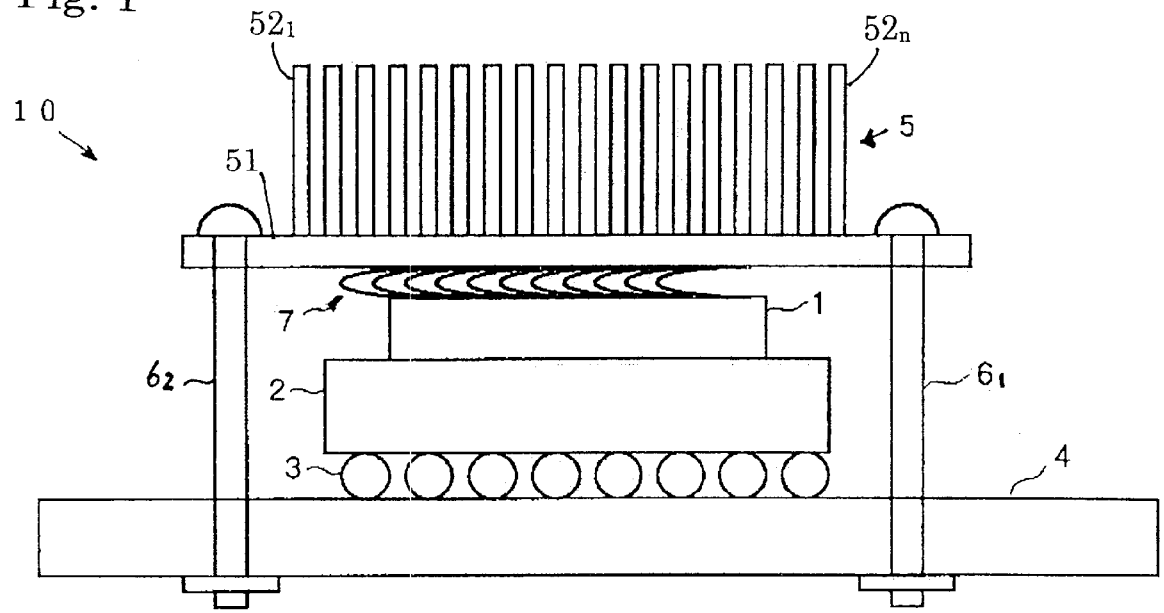
FIG. 1 is a cross-sectional view of a circuit module of a first embodiment of the present invention.

FIG. 1 illustrates one embodiment of a circuit module 10 according to the present invention. The circuit module 10 includes an IC chip 1 that is a heat source mounted on a BGA package 2. Under the surface of the BGA package 2, ball solder electrodes 3 are arranged in an array for constructing inputting and outputting pads. By melting the ball solder electrodes 3, the semiconductor package 2 is coupled to a printed wiring base board 4.

To diffuse the heat emitted from the IC chip 1, a heat sink unit 5 is fixed on the printed wiring base board 4 through fixing members, such as screws $6_1$, $6_2$. The heat sink unit 5 includes a radiation panel 51 facing towards the IC chip 1 and a plurality of projections $52_1$, - - - ,$52_n$. provided on the radiation panel 51 for securing a sufficient heat sink effect. The heat sink unit 5 is comprised of a high heat conductivity material, such as aluminum.

Consistent with the invention, a plurality of thermal coupling members 7 are provided between the IC chip 1 and the radiation panel 51 of the heat sink unit 5. Each of the plurality of thermal coupling members 7 has a sufficient heat conductivity and a predetermined flexibility. It is also applicable to construct the thermal coupling member 7 using, for example, copper, magnesium, tungsten, molybdenum and so on.

Figure 2:
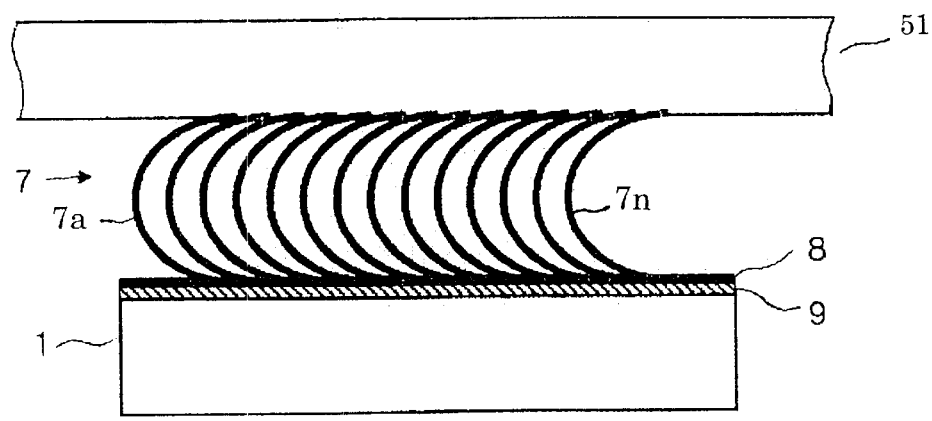
FIG. 2 is an enlarged cross-sectional view of a thermal connecting element shown in FIG. 1.

FIG. 2 illustrates one embodiment for forming the plurality of thermal coupling members. A plurality of the curved thin plates 7a, - - - ,7n of the heat coupling member 7 are formed by cutting-out and raising-up from the undersurface of the radiation plate 51 so that each of the thin plates has a predetermined curvature for keeping a predetermined flexibility.

Thus, each of the curved thin plates of the heat coupling member 7 is designed to have a predetermined flexibility to absorb the dimensional tolerances appearing among the elements of the circuit module. Since the plurality of the thin plates 7a, - - - ,7n, consistent with the invention, are integrally formed from the radiation plate 51, it becomes possible to obtain a sufficient radiation efficiency through the whole body of the heat coupling member 7 and the heat sink unit 5. Thus, it becomes possible to improve the radiation efficiency through the heat sink unit 5.

The optimum number of the plurality of curved thin plates 7a, - - - 7n is determined by trading off the heat resistance of the thin plate and the load between the IC chip 1 and the heat coupling member 7. For example, in case the upper limit for working of the IC chip 1 is 90 C., the heat resistance of the heat coupling member 7 is 6 C/W, the width of the thin plate is 10 mm, the thickness of the thin plate is 0.2 mm, the length of the thin plate is 9 mm, the deflection of the thin plate is 0.5 mm, the flexibility coefficient of the thin plate (in a perpendicular direction in FIG. 2) is 7,000, the flexural rigidity of the thin plate is 47 and the heat conductivity of the thin plate is 2 10 W/m-K, the load on each of the thin plates is 0.1 Kgf and the heat resistance of each of the thin plates is 43 CAV, the necessary number of the thin plates is 15.

By providing the heat coupling member 7 with a plurality of the curved thin plates, the circuit module 10 can reduce the load pressed on the IC chip 1 by as much as one sixth of the pressing load on the IC chip 1 when the conventional cool sheet is used as the heat coupling member of the circuit module, since each of the plurality of the thin plates of the circuit module 7, consistent with the invention, has its deflection of 0.5 mm for absorbing the dimensional tolerances.

The heat resistance of the curved thin plate of the heat coupling member, with consistent to the invention, has substantially, the same value as the heat resistance of the cool sheet. Consequently, if the condition of the dimensional tolerance is the same, it becomes possible for the heat coupling member of the curved thin plates to largely reduce the load on the IC chip in comparison to the conventional cool sheet. Thus, it can reduce the stresses to the circuit elements of the module.

As illustrated in FIG. 2, each of the edges of the cut-out of the plurality of thin plates 7a, - - - 7n are commonly brazed to an aluminum plate 8. Further, the aluminum plate 8 is fixed to the IC chip 1 through a grease member 9 for increasing the efficiency of the heat conductivity. Of course, it is possible to delete or add the aluminum plate 8 and the grease member 9, depending upon need.

By integrally forming the curved thin plates of the heat coupling member to the radiation plate of the heat sink unit, the heat emitted from the IC chip can be efficiently diffused through the whole body of the heat coupling member and the heat sink unit. Moreover, the stresses due to the dimensional tolerances among the elements can be reduced by absorbing the stresses in the curved thin plates of the heat coupling member.

Figure 3:
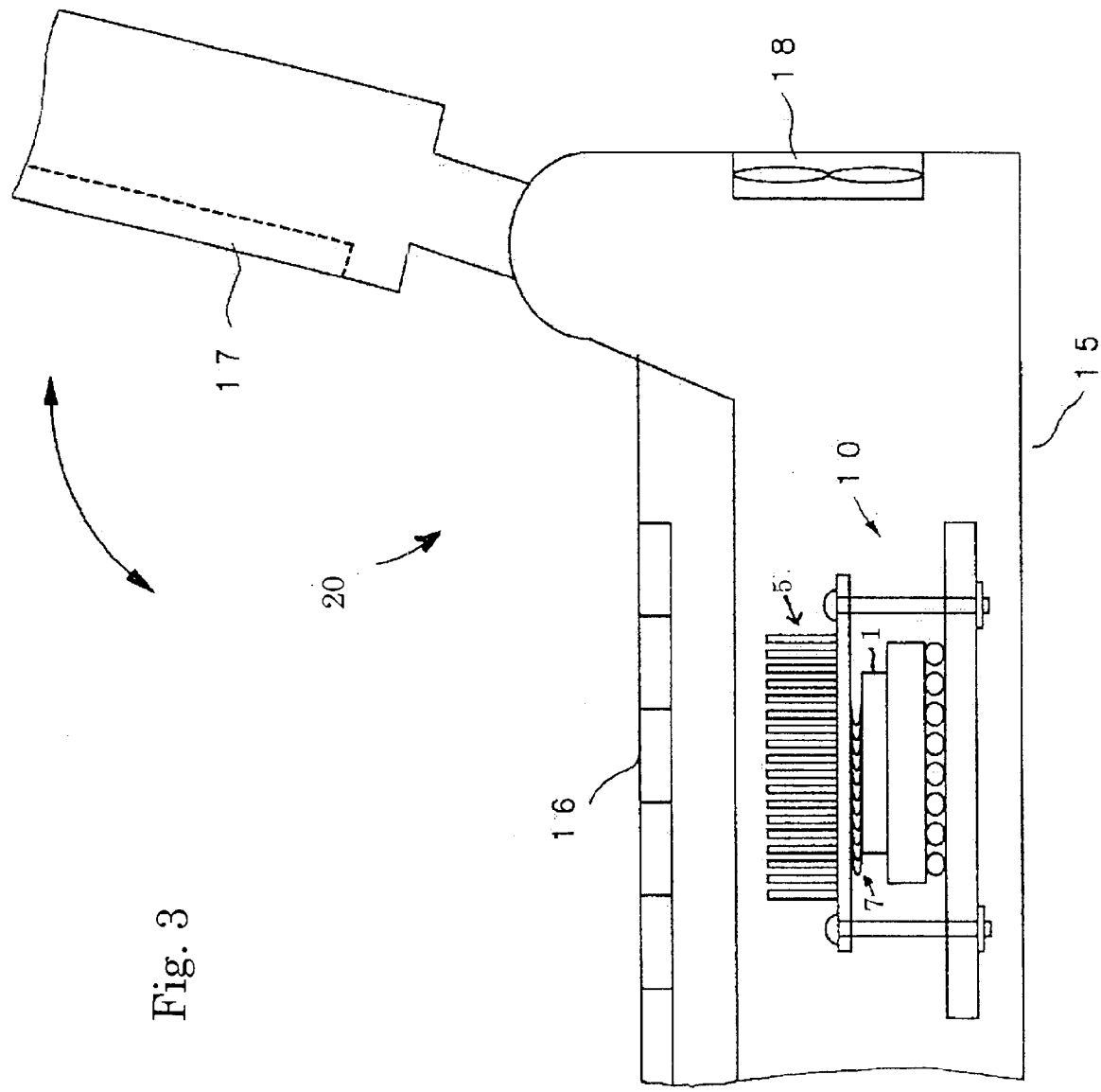
FIG. 3 is a cross-sectional view obtained by partially cutting off a main body of a personal computer for mounting the circuit module shown in FIG. 1.

FIG. 3 illustrates a hand-held personal computer 20 with a slim body comprising a main body 15 and a rotatable display unit 17 that is attached to the main body so as to cover the main body 15 when the computer is closed. Along one elongate edge of the main body 15, a mount portion is provided for attaching the rotatable display unit 17. The display unit 17 includes a display screen, e.g., a liquid crystal display. The main body 15 has an opening for attaching a keyboard unit 16 for inputting data. The keyboard 16 is electrically coupled to the liquid crystal display 17.

In the main body 15, the circuit module 10 consistent with the invention, is mounted under the keyboard unit 16 for processing data in the IC chip 1 mounted in the circuit module 10. At one surface of the main body 15 of the personal computer 20, a fan 18 is provided for introducing cooling air in the main body 15. The heat emitted from the IC chip 1 in the circuit module 10 is removed by the cooling air passing though the heat sink unit 5.

Figure 4:
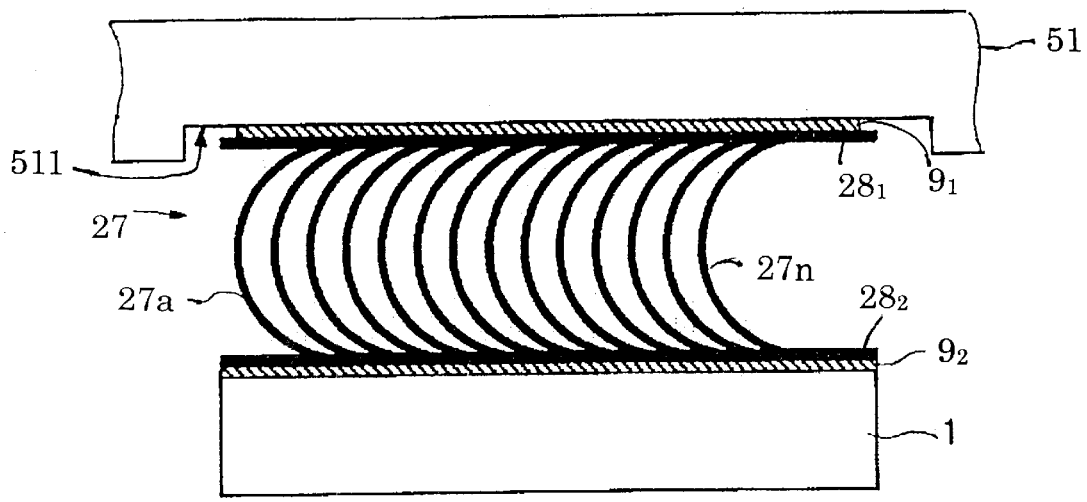
FIG. 4 is an enlarged cross-sectional view showing another embodiment of the thermal connecting element.

FIG. 4 illustrates another embodiment of the heat coupling member for constructing the circuit module, consistent with the invention. A characteristic feature of this embodiment is the formation of a heat coupling member 27 independent from the heat sink unit. In order to simplify the explanation, the same numerals are provided for the same elements in the embodiment of the circuit module illustrated in FIG. 1.

In this embodiment, the heat coupling member 27 is constructed by holding a plurality of curved thin plates 27a–27n between upper and lower aluminum plates $28_1$, $28_2$. Thus, although each of the plurality of the curved thin plates 27a, - - - ,27n are formed independently of a radiation plate 51 of the heat sink unit, each of the thin plates has substantially the same flexibility as the curved thin plates illustrated in FIG. 1.

In this embodiment, the plurality of the thin plates 27a, - - - , 27n are made by cutting-off and raising up one surface of the aluminum plate $28_1$, that is disposed facing against the radiation plate 51 of the heat sink unit, or one surface of the aluminum plate $28_2$, that is disposed facing against the IC chip 1. The opposite edges made of cutting-off from one aluminum plate are commonly brazed to the other aluminum plate having the same conductivity.

In the under surface of the radiation plate 51 facing toward the IC chip 1, a notching portion 511 is provided for determining a mounting position of the heat coupling member 27. Thus, during the construction of the circuit module, the notching portion 511 provided on the radiation plate 51 controls the movement range of the heat coupling member 27 so as to correctly dispose the position of the IC chip 1. Consequently, the heat coupling member 27 is easily positioned to accurately cover the surface of the heating source IC chip 1.

Between the aluminum plate $28_1$, and the radiation panel 51, a grease $9_1$ is provided for increasing the heat conductivity. Further, a grease $9_2$ is provided between the aluminum plate $28_2$ and the IC chip 1 for increasing the heat conductivity. Of course, it is possible to eliminate these greases, depending upon need.

By forming the heat coupling member 27 independently from the radiation panel 51, it becomes possible to selectively place the heat coupling member 27 so as to adjust a gap appearing between the IC chip 1 and the heat sink unit due to dimensional tolerance depending upon each of the circuit modules. Thus, it becomes possible to widely use the structure for a variety of the circuit modules.

It is also possible to construct the heat coupling member 27 by previously forming a plurality of curved thin plates 27a–27n and by arranging the curved thin plates 27a–27n to be held between the upper and lower aluminum plates 28₁, 28₂.

Figure 5:
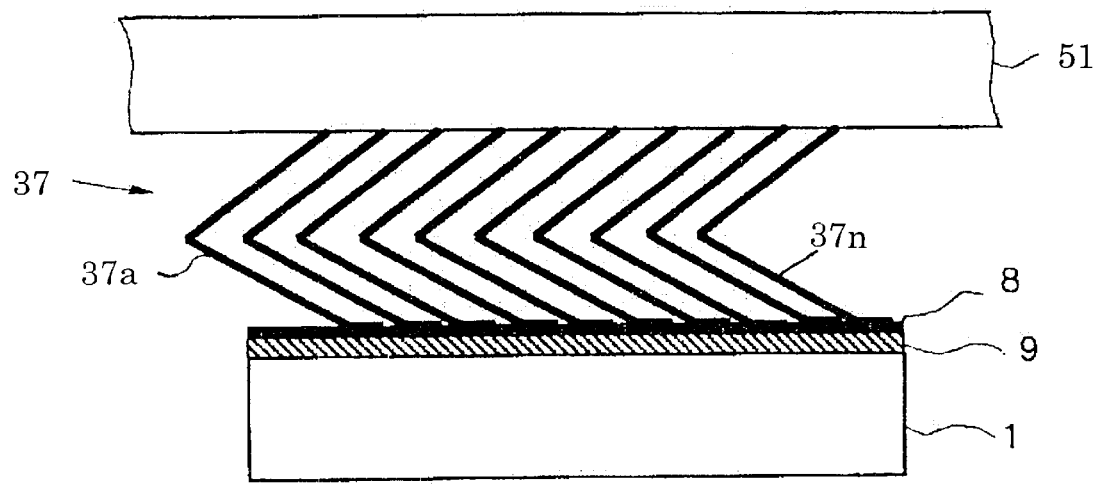
FIG. 5 is an enlarged cross-sectional view showing a further embodiment of the thermal connecting element.

FIG. 5 illustrates still another embodiment of the heat coupling member. A heat coupling member 37 is constructed from a plurality of thin plates having a shape other than a curved shape. In this embodiment, each of a plurality of a thin plates 37a–37n is bent at a predetermined position of the thin plates, the plates being formed by cutting off and raising up from the radiation panel 51.

The bent shaped thin plates 37a–37n are commonly brazed to an aluminum plate 8. It is, of course, possible to independently form the plurality of bent shaped thin plates 37a–37n from the radiation plate 51, as explained in the second embodiment.

In FIG. 5, when the bent shaped heat coupling member 37 is fixed on the IC chip 1, a grease 9 is disposed between the heat coupling member 37 and the aluminum plate 8 in order to reduce the contacting heat resistance.

It is possible to form the thin plates in any other shape in so far as the thin plate can have a predetermined flexibility for absorbing the dimensional tolerance when the elements are mounted as the circuit module.

As explained above, the structure and method for constructing the circuit module can efficiently radiate heat emitted from an electronic element and also can effectively reduce the stresses among the elements by absorbing dimensional tolerances by providing a heat coupling member of a plurality of thin plates having a predetermined flexibility.

Other embodiments of the present invention will be apparent to those skilled in the art from consideration of the specification and practice of the invention disclosed herein. In particular, the invention is applicable to any types of electronic equipment that need to efficiently radiate heat emitted from an electronic element and also to reduce stresses pressing the connecting portions between the elements for forming the circuit module.

It is intended that the specification and examples be considered as exemplary only, with a true scope and sprit of the invention being indicated by the following claims.

What is claimed is:

1. A circuit module structure, comprising:
   a wiring base board provided with a wiring pattern;
   an electronic element mounted on the wiring base board;
   a heat sink unit fixed on the wiring base board for radiating heat emitted from the electronic element, the heat sink unit including a radiation panel having a notching portion facing toward the electronic element and having a heat conductivity; and
   a heat conducting element provided between a surface of the heat sink unit facing the electronic element and a surface of the electronic element, the heat conducting element comprising a plurality of thin plate-like members for transferring heat emitted from the surface of the electronic element to the radiation panel, having a heat conductivity substantially the same as that of the radiation panel and a predetermined flexibility for absorbing stresses generated due to dimensional tolerances of the electronic element, wherein a mounting position of the heat conducting element is determined by the notching portion.

2. The circuit module structure of claim 1, wherein:
the plurality of thin plate-like members of the heat conducting element are integrally made from the surface of the radiation panel of the heat sink unit.

3. The circuit module structure of claim 1, wherein:
the notching portion is provided on a substantially same position of the electronic element.

4. An electronic equipment, comprising:
   a circuit module structure and a body for mounting the circuit module structure, the circuit module structure comprising:
   a wiring base board provided with a wiring pattern;
   an electronic element mounted on the wiring base board;
   a heat sink unit fixed on the wiring base board for radiating heat emitted from the electronic element, the heat sink unit including a radiation panel, having a notching portion facing toward the electronic element and having a heat conductivity; and
   a heat conducting element provided between a surface of the heat sink unit facing the electronic element and a surface of the electronic element, the heat conducting element comprising a plurality of thin plate-like members for transferring the heat emitted from the surface of the electronic element to the radiation panel having a heat conductivity substantially the same as that of the radiation panel and a predetermined flexibility for absorbing stresses generated due to dimensional tolerances of the electronic element, wherein a mounting position of the heat conducting element is determined by the notching portion.

5. The electronic equipment of claim 4, wherein:
the plurality of thin plate-like members of the heat conducting elements are integrally made from the surface of the radiation panel of the heat sink unit.

6. The electronic equipment of claim 4, wherein:
the notching element is provided on the substantially same position of the electronic element.

* * * * *